US012763012B2

(12) United States Patent
Son

(10) Patent No.: US 12,763,012 B2
(45) Date of Patent: Oct. 13, 2026

(54) DOUBLE-SIDED EMISSIVE TRANSPARENT DISPLAY DEVICE

(71) Applicant: LG Display Co., Ltd., Seoul (KR)

(72) Inventor: HyeonHo Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/352,153

(22) Filed: Oct. 7, 2025

(65) Prior Publication Data

US 2026/0038429 A1 Feb. 5, 2026

Related U.S. Application Data

(63) Continuation of application No. 18/429,036, filed on Jan. 31, 2024, now Pat. No. 12,462,732, which is a (Continued)

(30) Foreign Application Priority Data

Apr. 29, 2022 (KR) ........................ 10-2022-0053647

(51) Int. Cl.

*G09G 3/32* (2016.01)
*H10H 20/856* (2025.01)
*H10W 90/00* (2026.01)

(52) U.S. Cl.

CPC ............. *G09G 3/32* (2013.01); *H10H 20/856* (2025.01); *H10W 90/00* (2026.01); *G09G 2300/0426* (2013.01); *G09G 2300/0456* (2013.01); *G09G 2300/0842* (2013.01); *G09G 2320/0233* (2013.01); *G09G 2320/043* (2013.01)

(58) Field of Classification Search

CPC ............. G09G 3/32; G09G 2300/0426; G09G 2300/0456; G09G 2300/0842; G09G 2320/0233; G09G 2320/043; H01L 25/167; H01L 25/0753; H10H 20/856; (Continued)

(56) References Cited

U.S. PATENT DOCUMENTS 11,751,458 B2 * 9/2023 Park ..................... G09G 3/3225 257/40
12,525,194 B2 * 1/2026 Han ..................... G09G 3/3266
(Continued)

FOREIGN PATENT DOCUMENTS

KR 10-2018-0062289 A 6/2018
KR 10-2019-0073093 A 6/2019

*Primary Examiner* — Andrew Sasinowski
(74) *Attorney, Agent, or Firm* — Morgan, Lewis & Bockius LLP

(57) ABSTRACT

A display device includes a first pixel that emits light toward an upper side, a second pixel that emits light toward a lower side, a plurality of lines and a pad electrode. The first pixel includes a first light emitting element, a first pixel circuit connected to the first light emitting element and some of the plurality of lines and a bottom reflective layer that is under the first light emitting element to overlap the first light emitting element and has a greater size than the first light emitting element. The second pixel includes a second light emitting element, a second pixel circuit connected to the second light emitting element and the others of the plurality of lines, and a top reflective layer that on the second light emitting element to overlap the second light emitting element and has a greater size than the second light emitting element.

14 Claims, 14 Drawing Sheets

Related U.S. Application Data continuation of application No. 18/119,044, filed on Mar. 8, 2023, now Pat. No. 11,922,865.

(58) Field of Classification Search
CPC .. H10H 20/857; H10H 29/142; H10D 86/441; H10D 86/471; H10D 86/60
See application file for complete search history.

(56) References Cited

U.S. PATENT DOCUMENTS

| | | | | |
|---|---|---|---|---|
| 2015/0097195 | A1 | 4/2015 | Wada et al. | |
| 2015/0179876 | A1* | 6/2015 | Hu | H10H 20/812 257/13 |
| 2017/0336690 | A1 | 11/2017 | Lee et al. | |
| 2019/0035773 | A1 | 1/2019 | Lo et al. | |
| 2019/0189727 | A1 | 6/2019 | Kim et al. | |
| 2020/0005709 | A1 | 1/2020 | Kim et al. | |
| 2020/0119126 | A1* | 4/2020 | Jo | H10D 86/441 |
| 2021/0175316 | A1 | 6/2021 | Furukawa | |
| 2021/0399042 | A1 | 12/2021 | Li et al. | |
| 2022/0037420 | A1 | 2/2022 | Jang et al. | |
| 2022/0085077 | A1 | 3/2022 | Lee et al. | |
| 2022/0352268 | A1 | 11/2022 | Seo et al. | |
| 2022/0375996 | A1 | 11/2022 | Kim et al. | |
| 2025/0279052 | A1* | 9/2025 | Kim | G09G 3/3233 |

* cited by examiner

DOUBLE-SIDED EMISSIVE TRANSPARENT DISPLAY DEVICE

CROSS-REFERENCE TO RELATED APPLICATIONS

This application is a continuation of U.S. application Ser. No. 18/429,036, filed on Jan. 31, 2024, which is a continuation of U.S. application Ser. No. 18/119,044, filed on Mar. 8, 2023, which claims the priority of Korean Patent Application No. 10-2022-0053647 filed on Apr. 29, 2022, in the Korean Intellectual Property Office, the entirety of each of which is incorporated herein by reference for all purposes.

BACKGROUND

Technical Field

The present disclosure relates to a double-sided emissive transparent display device. The present disclosure relates to a display device having a transparent region and an emissive region in a single pixel and including a top emissive pixel and a bottom emissive pixel.

Discussion of the Related Art

Display devices used in monitors of computers, TVs, and cell phones include organic light emitting display devices (OLEDs), which autonomously emit light, and liquid crystal display devices (LCDs) requiring a separate light source.

Display devices have a wide range of diverse applications, including personal digital assistants, as well as monitors of computers and TVs. A display device with a large display area and reduced volume and weight is being studied.

Recently, display devices including LEDs are attracting attention as the next generation display device. LEDs are made of an inorganic material instead of an organic material, and therefore have excellent reliability and a longer lifetime than LCDs or OLEDs. Also, the LEDs can be turned on and off quickly, have a high luminous efficiency, are robust to impact and stable, and can display a high-brightness image. Thus, they have been utilized as display devices having various purposes and functions. In particular, when the LEDs are applied to a double-sided emissive transparent display device, it is possible to display a high-brightness image and provide accurate image information to a user.

SUMMARY

Accordingly, embodiments of the present disclosure are directed to a double-sided emissive transparent display device that substantially obviates one or more of the problems due to limitations and disadvantages of the related art.

An aspect of the present disclosure is to provide a display device that becomes transparent when not in use to let a user see the background through and that provides a display function when in use.

Another aspect of the present disclosure is to provide a display device that includes both a top emissive pixel and a bottom emissive pixel and thus may display different information on its both surfaces.

Yet another aspect of the present disclosure is to provide a display device that uses inorganic light emitting elements and thus improves the reliability and brightness of a product.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a double-sided emissive transparent display device comprises a first pixel that emits light toward an upper side, which is a front surface, of a substrate, a second pixel that emits light toward a lower side, which is a back surface, of the substrate, a plurality of lines disposed in the first pixel and the second pixel and a pad electrode connected to the plurality of lines, wherein the first pixel includes a first light emitting element, a first pixel circuit connected to the first light emitting element and some of the plurality of lines and a bottom reflective layer that is disposed under the first light emitting element to overlap the first light emitting element and has a greater size than the first light emitting element, and the second pixel includes a second light emitting element, a second pixel circuit connected to the second light emitting element and the others of the plurality of lines and a top reflective layer that is disposed on the second light emitting element to overlap the second light emitting element and has a greater size than the second light emitting element.

In another aspect, a double-sided emissive transparent display device comprises a substrate that includes an emissive region including a top emissive region and a bottom emissive region, a transmissive region, and a non-transmissive region a first light emitting element and a second light emitting element disposed on the substrate in the emissive region a plurality of pixel circuits configured to supply driving currents to the first light emitting element and the second light emitting element in the non-transmissive region a bottom reflective layer overlapping the first light emitting element between the first light emitting element disposed in the top emissive region and the substrate and a top reflective layer overlapping the second light emitting element on the second light emitting element disposed in the bottom emissive region Other detailed matters of the exemplary embodiments are included in the detailed description and the drawings.

According to an example embodiment of the present disclosure, a display device includes a top emissive pixel and a bottom emissive pixel and thus may provide different image information on its front and back surfaces.

According to an example embodiment of the present disclosure, the top emissive pixel and the bottom emissive pixel include a bottom reflective layer and a top reflective layer, respectively, so as to overlap a light emitting element. Both the bottom reflective layer and the top reflective layer have a greater area than the light emitting element. Thus, light emitted from the top emissive pixel may be fully output upwards, and light emitted from the bottom emissive pixel may be fully output downwards.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
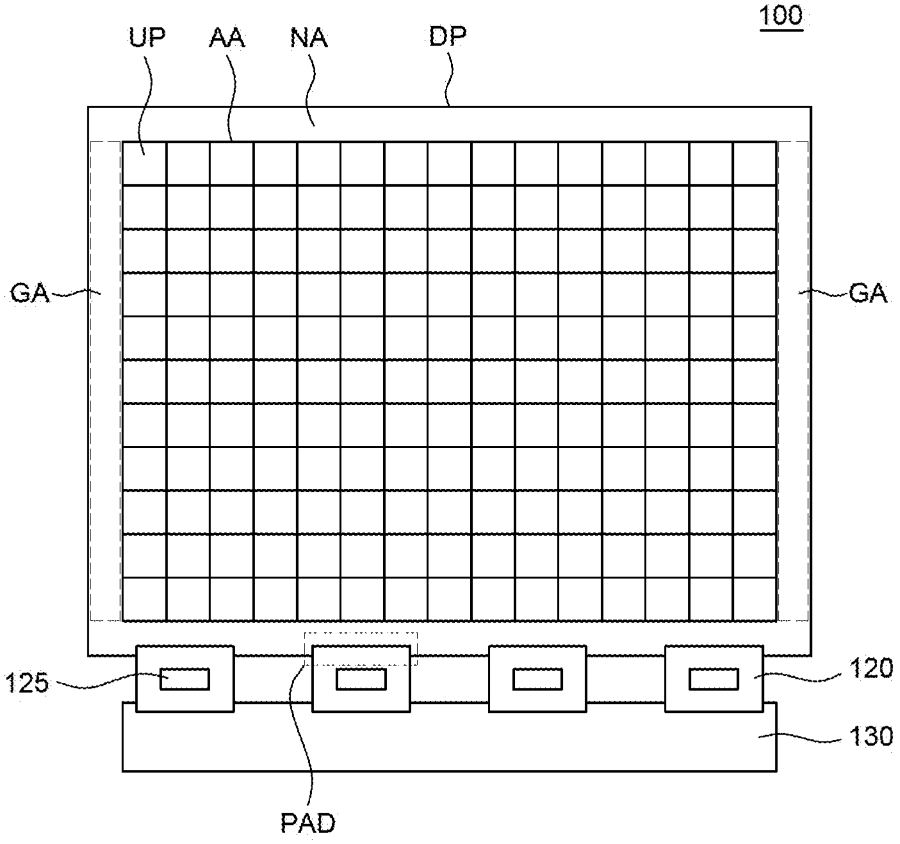
FIG. 1A is a schematic plan view of a double-sided emissive transparent display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly on the another element or layer, or another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 1B:
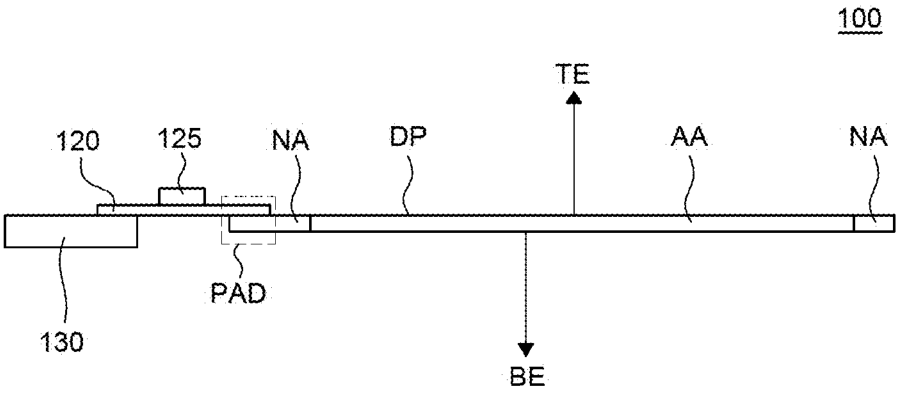
FIG. 1B is a schematic cross-sectional view of the double-sided emissive transparent display device according to an exemplary embodiment of the present disclosure.

FIG. 1A is a schematic plan view of a double-sided emissive transparent display device according to an exemplary embodiment of the present disclosure. FIG. 1B is a schematic cross-sectional view of the double-sided emissive transparent display device according to an exemplary embodiment of the present disclosure.

Referring to FIG. 1A, a double-sided emissive transparent display device 100 includes a display panel DP and display panel driving circuits GA and 125 that supply signals for driving the display panel DP. Also, the double-sided emissive transparent display device 100 includes a timing controller 130 that controls the display panel driving circuits GA and 125.

The display panel DP includes an active area AA where an image is displayed, and a non-active area NA where an image is not displayed. A plurality of pixels UP is disposed in the active area AA, and a plurality of light emitting elements and a plurality of pixel circuits are disposed in each of the plurality of pixels UP.

Also, signal lines connected to the plurality of pixels UP may be disposed in the display panel DP. The signal lines may include a gate line, a data line, a power line, etc. The display panel driving circuits GA and 125 supply signals to the signal lines. The display panel driving circuits GA and 125 include a gate driving circuit GA that supplies a gate signal to the gate line and a data driving circuit 125 that supplies a data signal to the data line. The gate driving circuit GA may be directly formed on the display panel DP as the plurality of pixel circuits in the active area AA, but is not limited thereto. The gate line may include a scan line and an emission line, and, thus, the gate driving circuit GA may include a scan driving circuit and an emission driving circuit. The scan driving circuit may supply a scan signal to the scan line, and the emission driving circuit may supply an emission signal to the emission line. The type and number of gate lines may vary depending on the structure of a pixel circuit formed in a unit pixel UP.

The data driving circuit 125 may be disposed on a film 120 attached to a pad area PAD formed on one side of the display panel DP according to a chip on film method. The number of data driving circuits 125 may vary depending on the size of the display panel DP. One side of the film 120 to which the data driving circuit 125 is attached may be attached to one side of the display panel DP, and the other side of the film 120 may be attached to a printed circuit board 130. The printed circuit board 130 is supplied with timing signals and driving power for operating the display panel driving circuits GA and 125. The number of printed circuit boards 130 may vary depending on the size of the display panel DP. In addition, one or more films 120 may be attached to a single printed circuit board 130.

FIG. 1B shows a cross-sectional view of the display panel DP, the data driving circuit 125, the film 120 with the data driving circuit 125 attached thereto, and the printed circuit board 130. In the double-sided emissive transparent display device 100 according to an exemplary embodiment of the present disclosure, the plurality of pixels UP disposed in the active area AA includes a top emissive pixel and a bottom emissive pixel. The top emissive pixel performs top emission TE, and the bottom emissive pixel performs bottom emission BE. An image supplied to the top emissive pixel may be different from that supplied to the bottom emissive pixel. For example, two persons may stand on a front surface side and a back surface side, respectively, of the display panel DP across the double-sided emissive transparent display device 100. In this case, the person standing on the front surface side of the display panel DP may see an image displayed on the top emissive pixel, and the person standing on the back surface side of the display panel DP may see an image displayed on the bottom emissive pixel.

Figure 2A:
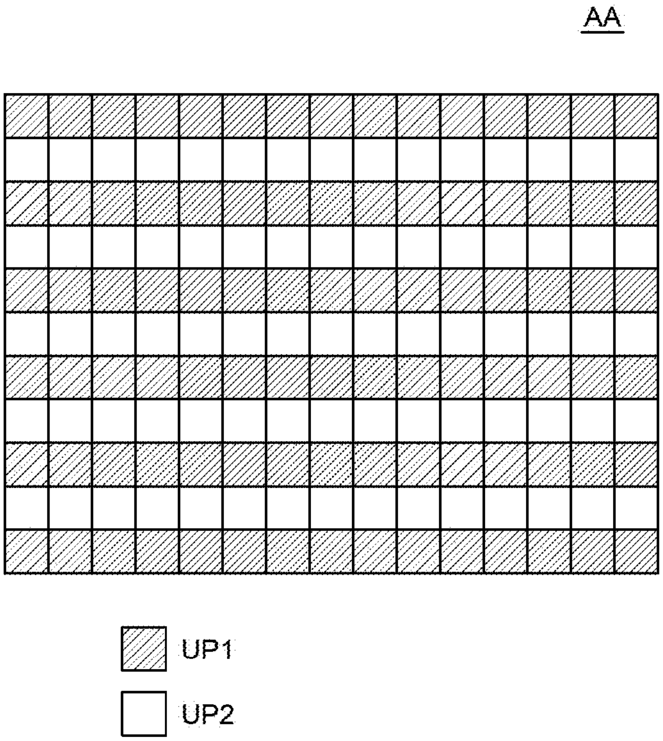
FIGS. 2A, 2B and 3 are diagrams each showing the array of pixels in an active area.
Figure 2B:
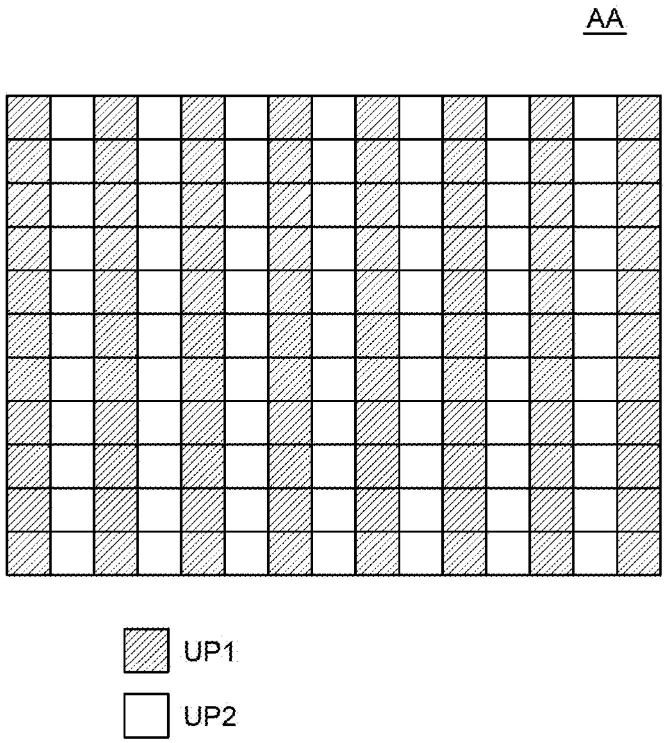
Figure 3:
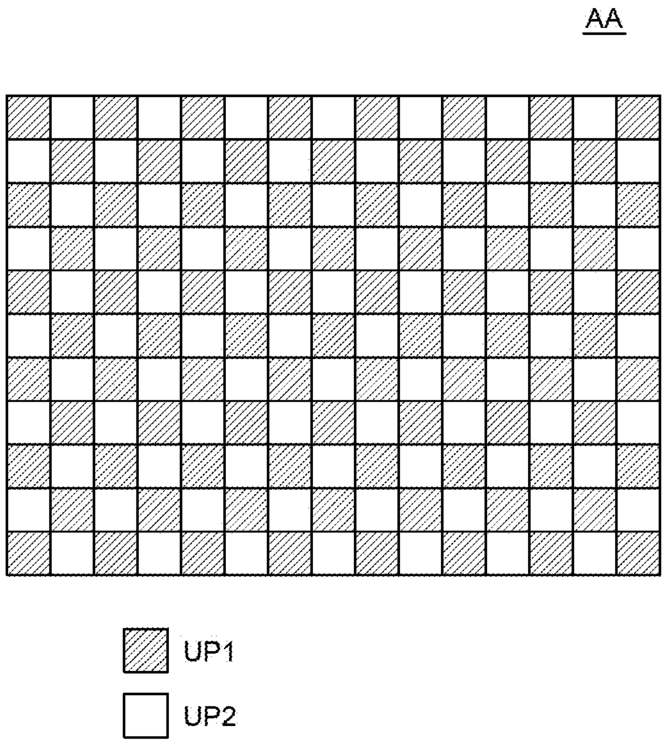

FIGS. 2A, 2B and 3 are diagrams each showing the array of pixels in the active area AA.

The plurality of pixels UP disposed in the active area AA includes first pixels UP1 and second pixels UP2. The first pixels UP1 are top emissive pixels, and the second pixels UP2 are bottom emissive pixels.

Referring to FIG. 2A, the plurality of pixels UP disposed in the display panel DP is divided by row, and the pixels disposed in the same row are of the same type. FIG. 2A illustrates that the first pixel UP1 and the second pixel UP2 are sequentially disposed in an alternating manner from the top of the display panel DP. However, the present disclosure is not limited thereto. The second pixel UP2 and the first pixel UP1 may be sequentially disposed in an alternating manner. In this case, the same row may refer to a row in which the pixels connected by the same gate line are disposed.

Referring to FIG. 2B, the plurality of pixels UP disposed in the display panel DP is divided by column, and the pixels disposed in the same column are of the same type. FIG. 2B illustrates that the first pixel UP1 and the second pixel UP2 are sequentially disposed in an alternating manner from the left of the display panel DP. However, the present disclosure is not limited thereto. The second pixel UP2 and the first pixel UP1 may be sequentially disposed in an alternating manner. In this case, the same column may refer to a column in which the pixels connected by the same data line are disposed. The layout of different pixels disposed in alternating rows or columns as shown in FIGS. 2A and 2B may be referred to as "line by line" pattern. In this case, the lines, as alternating units, may be singular or plural.

Referring to FIG. 3, the plurality of pixels UP disposed in the display panel DP is divided by row. As for the pixels disposed in the same row, the first pixel UP1 and the second pixel UP2 are sequentially disposed in an alternating manner from the left of the display panel DP. Also, the plurality of pixels UP disposed in the display panel DP is divided by column. As for the pixels disposed in the same column, the first pixel UP1 and the second pixel UP2 are sequentially disposed in an alternating manner from the top of the display panel DP. The second pixels UP2 are disposed on the top and bottom and the left and right sides of the first pixel UP1, and the same type of pixels are disposed in a diagonal direction. For example, when the first pixel UP1 and the second pixel UP2 are sequentially disposed in a first row in an alternating manner from the left, the second pixel UP2 and the first pixel UP1 may be sequentially disposed in a second row in an alternating manner from the left. The layout of different pixels disposed in alternating pixels as shown in FIG. 3 may be referred to as "mosaic" pattern. In this case, the pixels, as alternating units, may be singular or plural.

Figure 4:
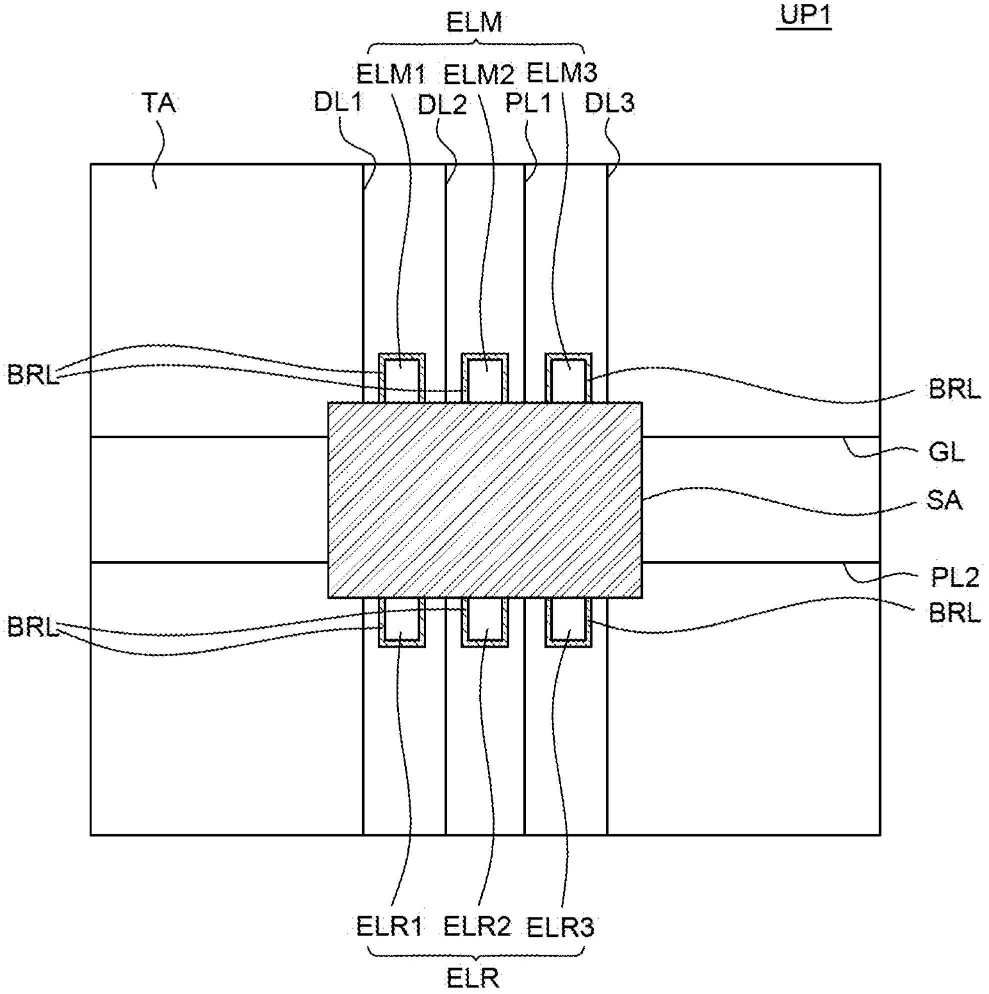
FIG. 4 is a diagram schematically illustrating the structure of a first pixel of the double-sided emissive transparent display device according to an exemplary embodiment of the present disclosure.
Figure 5:
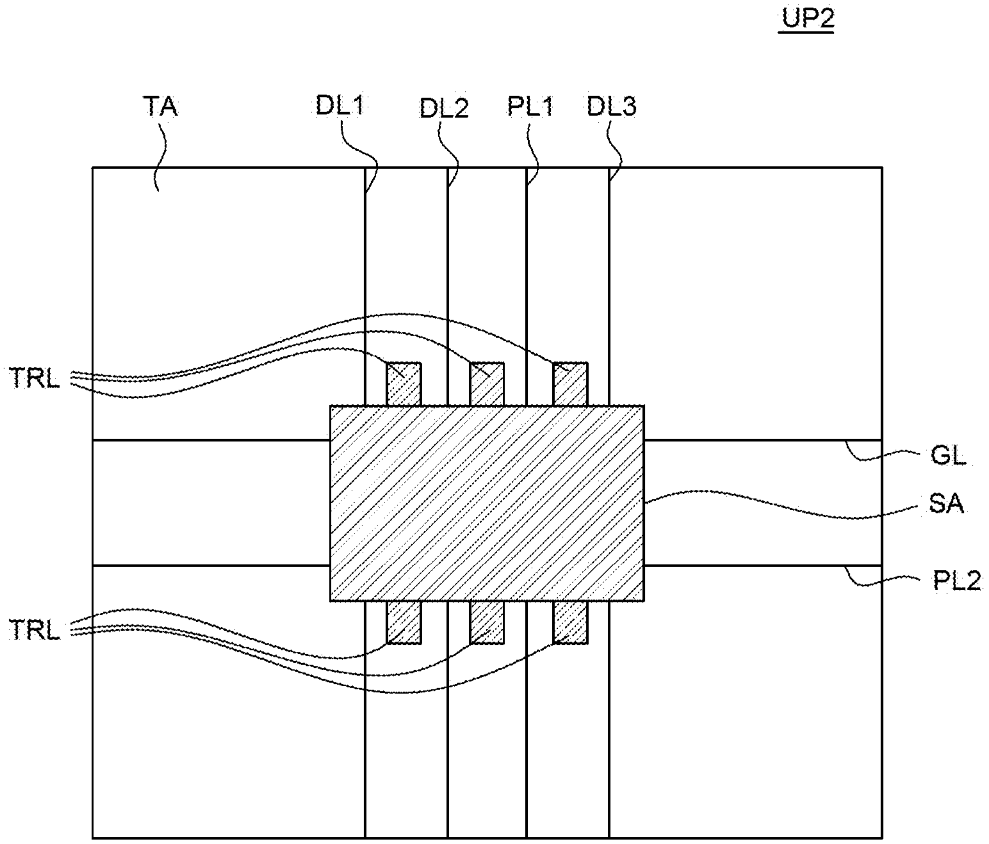
FIG. 5 is a diagram schematically illustrating the structure of a second pixel of a double-sided emissive transparent display device according to another exemplary embodiment of the present disclosure.

FIG. 4 is a diagram schematically illustrating the structure of the first pixel UP1 of the double-sided emissive transparent display device according to an exemplary embodiment of the present disclosure. FIG. 5 is a diagram schematically illustrating the structure of the second pixel UP2 of the double-sided emissive transparent display device according to an exemplary embodiment of the present disclosure.

Referring to FIGS. 4 and 5, each of the plurality of pixels UP1 and UP2 disposed in the active area AA of the double-sided emissive transparent display device 100 according to an exemplary embodiment of the present disclosure includes a transmissive region TA, an emissive region, and a non-transmissive region SA. When a user sees the display panel DP from the front side, the transmissive region TA is a transparent region through which the background of the display panel DP may be seen. The emissive region is a region in which light emitting elements ELM and ELR are disposed to provide an image for display on the display device.

The light emitting elements ELM and ELR may be light emitting diodes made of inorganic materials, and may refer to elements having a size of 100 μm or less or from which a wafer substrate for forming light emitting diodes is removed. In general, such light emitting elements are referred to as "micro LEDs".

Each of the plurality of pixels UP1 and UP2 may include a plurality of light emitting elements ELM and ELR. The plurality of light emitting elements ELM and ELR may include a main light emitting element ELM and an auxiliary light emitting element ELR. The plurality of light emitting elements ELM and ELR may include at least one pair of a main light emitting element ELM and an auxiliary light emitting element ELR that emit light of the same color.

Also, each of the plurality of pixels UP1 and UP2 may include a plurality of main light emitting elements ELM and a plurality of auxiliary light emitting elements ELR. The plurality of main light emitting elements ELM may include a first main light emitting element ELM1, a second main light emitting element ELM2, and a third main light emitting element ELM3. The first main light emitting element ELM1 may be a red light emitting element that emits red light. The second main light emitting element ELM2 may be a blue light emitting element that emits blue light. The third main light emitting element ELM3 may be a green light emitting element that emits green light. The plurality of auxiliary light emitting elements ELR may include a first auxiliary light emitting element ELR1, a second auxiliary light emitting element ELR2, and a third auxiliary light emitting element ELR3. The first auxiliary light emitting element ELR1 may be a red light emitting element that emits red light. The second auxiliary light emitting element ELR2 may be a blue light emitting element that emits blue light. The third auxiliary light emitting element ELR3 may be a green light emitting element that emits green light.

FIGS. 4 and 5 illustrate that each of the main light emitting element ELM and the auxiliary light emitting element ELR includes three light emitting elements. However, the present disclosure is not limited thereto. Each of the main light emitting element ELM and the auxiliary light emitting element ELR may include four light emitting elements including a white light emitting element. Alternatively, each of the main light emitting element ELM and the auxiliary light emitting element ELR may include a combination of any three of red, blue, green and white. Otherwise, each of the main light emitting element ELM and the auxiliary light emitting element ELR may include a combination of at least one other than red, blue, green and white.

A pixel circuit configured to control whether the main light emitting element ELM and the auxiliary light emitting element ELR emit light and the amount of light is disposed between the main light emitting element ELM and the auxiliary light emitting element ELR. The non-transmissive region SA is a region that does not transmit light through the display panel DP, and the pixel circuit is disposed in the non-transmissive region SA.

The non-transmissive region SA may be located at the center of the pixel UP1 or UP2. The main light emitting element ELM may be disposed on one side of the non-transmissive region SA, and the auxiliary light emitting element ELR may be disposed on the other side of the non-transmissive region SA which faces with the former one side of the non-transmissive region SA.

Signal lines that supply signals to the pixel circuit are disposed in the pixel UP1 or UP2. The signal lines are formed from the pad area PAD of the display panel DP and connected to the pixel circuit in the non-transmissive region SA through the transmissive region TA of the pixel.

The signal lines may include data lines, gate lines, and power lines. The data lines and the gate lines may be disposed crossing each other based on the display panel DP. The data lines may include a first data line DL1, a second data line DL2, and a third data line DL3. The number of data lines may vary depending on the number of light emitting elements included in each of the pixels UP1 and UP2. For example, the first data line DL1 may be connected to both the first main light emitting element ELM1 and the first auxiliary light emitting element ELR1. The second data line DL2 may be connected to both the second main light emitting element ELM2 and the second auxiliary light emitting element ELR2. The third data line DL3 may be connected to both the third main light emitting element ELM3 and the third auxiliary light emitting element ELR3. However, the present disclosure is not limited thereto. In at least one of the first light emitting elements ELM1 and ELR1, the second light emitting elements ELM2 and ELR2, and the third light emitting elements ELM3 and ELR3, a main light emitting element and an auxiliary light emitting element may be connected to different data lines, respectively.

A gate line GL may be connected to both a main light emitting element and an auxiliary light emitting element. However, the present disclosure is not limited thereto. The main light emitting element and the auxiliary light emitting element may be connected to different gate lines, respectively.

Power lines PL1 and PL2 include a first power line PL1 and a second power line PL2. The first power line PL1 may be disposed in parallel to the data line and the second power line PL2 may be disposed in parallel to the gate line. However, the present disclosure is not limited thereto. All the first power line PL1 and the second power line PL2 may be disposed in parallel to each other in the same direction. Also, each of the power lines PL1 and PL2 may be connected to the same light emitting element within a pixel. However, the present disclosure is not limited thereto. For example, if a main light emitting element and an auxiliary light emitting element are connected to different data lines, respectively, the main light emitting element and the auxiliary light emitting element may be connected to different power lines, respectively.

Referring to FIG. 4, the first pixel UP1 is the top emissive pixel, and, thus, a bottom reflective layer BRL is disposed under the light emitting element. The bottom reflective layer BRL has a greater area than the light emitting element when viewed from the top. The bottom reflective layer BRL is disposed under each of the main light emitting elements ELM1, ELM2 and ELM3 and the auxiliary light emitting elements ELR1, ELR2 and ELR3.

Referring to FIG. 5, the second pixel UP2 is the bottom emissive pixel, and, thus, a top reflective layer TRL is disposed on the light emitting element. The top reflective layer TRL has a greater area than the light emitting element when viewed from the top. The top reflective layer TRL is disposed on each of the main light emitting elements and the auxiliary light emitting elements. The top reflective layer TRL may penetrate a plurality of planarization layers surrounding the light emitting elements and be connected to the pixel circuit.

Figure 6:
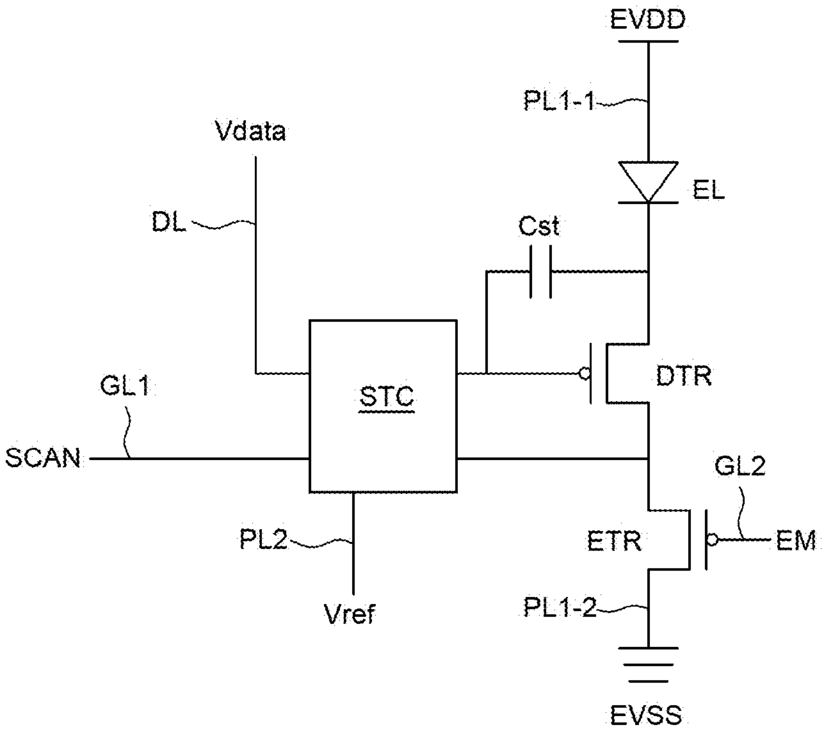
FIG. 6 is a circuit diagram illustrating a pixel circuit disposed in each pixel.

FIG. 6 is a circuit diagram illustrating a pixel circuit disposed in each pixel.

A pixel circuit configured to control whether the light emitting element emits light and the amount of light is disposed in each of the pixels UP1 and UP2. The pixel circuit may be connected to both the main light emitting element and the auxiliary light emitting element. Otherwise, the main light emitting element and the auxiliary light emitting element may be connected to different pixel circuits, respectively.

Further, the first light emitting elements ELM1 and ELR1, the second light emitting elements ELM2 and ELR2, and the third light emitting elements ELM3 and ELR3 are connected to different pixel circuits, respectively. For example, the first main light emitting element ELM1 may be connected to a first pixel circuit, and the first auxiliary light emitting element ELR1 may be connected to a second pixel circuit. Also, the second main light emitting element ELM2 and the second auxiliary light emitting element ELR2 may be connected to a third pixel circuit, and the third main light emitting element ELM3 and the third auxiliary light emitting element ELR3 may be connected to a fourth pixel circuit. The same connection structure is applied between the pixel circuit and each of the light emitting elements. The third pixel circuit may be disposed to correspond in one-to-one with the number of the second light emitting elements, and the fourth pixel circuit may be disposed to correspond in one-to-one with number of the third light emitting elements.

FIG. 6 shows a connection relationship between a light emitting element EL and a pixel circuit. The pixel circuit includes a driving transistor DTR, a switching circuit STC, a light emitting transistor ETR, and a capacitor Cst. The transistors included in the pixel circuit may be thin film transistors, and a P-channel metal oxide semiconductor (PMOS) will be described as an example. However, the present disclosure is not limited thereto. An N-channel metal oxide semiconductor (NMOS) or both of the PMOS and the NMOS may be used to implement.

The light emitting element EL includes an anode and a cathode. The anode is connected to a first-first power line PL1-1, and the cathode is connected to the pixel circuit. The first-first power line PL1-1 is a high-potential power line for supplying a high-potential voltage EVDD to the anode. The first-first power line PL1-1 is included in the first power line PL1. In this case, the light emitting element EL comprehensively refers to the main light emitting element ELM and the auxiliary light emitting element ELR.

The driving transistor DTR includes a gate electrode, a source electrode, and a drain electrode. The source electrode is connected to the cathode of the light emitting element EL. The driving transistor DTR supplies a driving current to the light emitting element EL so that the light emitting element EL may emit light.

The drain electrode of the driving transistor DTR is connected to a source electrode of the light emitting transistor ETR. A drain electrode of the light emitting transistor ETR is connected to a first-second power line PL1-2. The first-second power line PL1-2 is a low-potential power line for supplying a low-potential voltage EVSS. The first-second power line PL1-2 is included in the first power line PL1. A gate electrode of the light emitting transistor ETR is connected to an emission line GL2 and controlled by an emission signal EM. The emission signal EM controls turn-on and turn-off states of the light emitting transistor ETR so that the light emitting element EL does not emit light in a period except for an emission period of the light emitting element EL.

The switching circuit STC controls the driving transistor DTR using a data voltage Vdata, a scan signal SCAN, and a reference voltage Vref. The switching circuit STC may be formed by combining a plurality of transistors and a plurality of capacitors. The switching circuit STC is electrically connected to the driving transistor DTR, the light emitting transistor ETR, the capacitor Cst and the light emitting element EL. The data voltage Vdata is supplied through the data line DL, the scan signal SCAN is supplied through the scan line GL1, and the reference voltage Vref is supplied through the second power line PL2.

The capacitor Cst is connected between the gate electrode and the source electrode of the driving transistor DTR. Thus, the capacitor Cst maintains a constant voltage difference between the gate electrode and the source electrode of the driving transistor DTR during emission of light and thus maintains emission of light.

Figure 7:
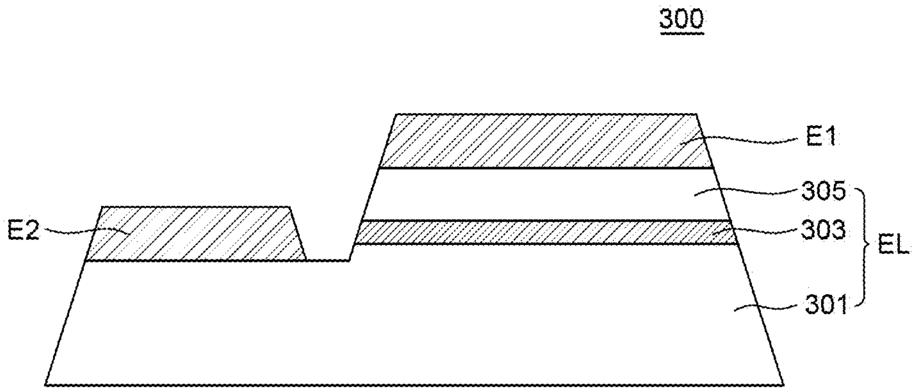
FIG. 7 is a cross-sectional view of a light emitting chip included in each pixel of the double-sided emissive transparent display device.

FIG. 7 is a cross-sectional view of a light emitting chip included in each pixel of the double-sided emissive transparent display device.

Referring to FIG. 7, a light emitting chip 300 includes the light emitting element EL, and a first electrode E1 and a second electrode E2 for electrically connecting the light emitting element EL to the pixel circuit. The light emitting element EL emits light by recombination of electrons and holes depending on a current flowing between the first electrode E1 and the second electrode E2. The light emitting element EL may include a first semiconductor layer 301, an active layer 303, and a second semiconductor layer 305.

The first semiconductor layer 301 supplies electrons to the active layer 303. For example, the first semiconductor layer 301 may be made of an n-GaN-based semiconductor material. The n-GaN-based semiconductor material may be GaN, AlGaN, InGaN, or AlInGaN. In this case, Si, Ge, Se, Te, or C may be used as an impurity for doping the first semiconductor layer 301.

The active layer 303 is provided on one side of the first semiconductor layer 301. The active layer 303 has a multi quantum well (MQW) structure having a well layer and a barrier layer having a higher band gap than the well layer. For example, the active layer 303 may have an MQW structure such as InGaN/GaN.

The second semiconductor layer 305 is provided on the active layer 303 to supply holes to the active layer 303. For example, the second semiconductor layer 305 may be made of a p-GaN-based semiconductor material. The p-GaN-based semiconductor material may be GaN, AlGaN, InGaN, or AlInGaN. In this case, Mg, Zn, or Be may be used as an impurity for doping the second semiconductor layer 305.

The first electrode E1 disposed on the second semiconductor layer 305 is in contact with the second semiconductor layer 305. The second electrode E2 disposed on the other side of the first semiconductor layer 301 is in contact with the first semiconductor layer 301. The light emitting chip 300 emits light by recombination of electrons and holes depending on the current flowing between the first electrode E1 and the second electrode E2. Light emitted from the light emitting element EL is output in all directions to display an image. In this case, light emitted from the light emitting element EL may penetrate each of the first electrode E1 and the second electrode E2. The first electrode E1 of the light emitting chip 300 may be referred to as an anode electrode, and the second electrode E2 may be referred to as a cathode electrode.

Hereinafter, the cross-section of the display panel DP in which the light emitting chip 300 is disposed will be described.

Figure 8:
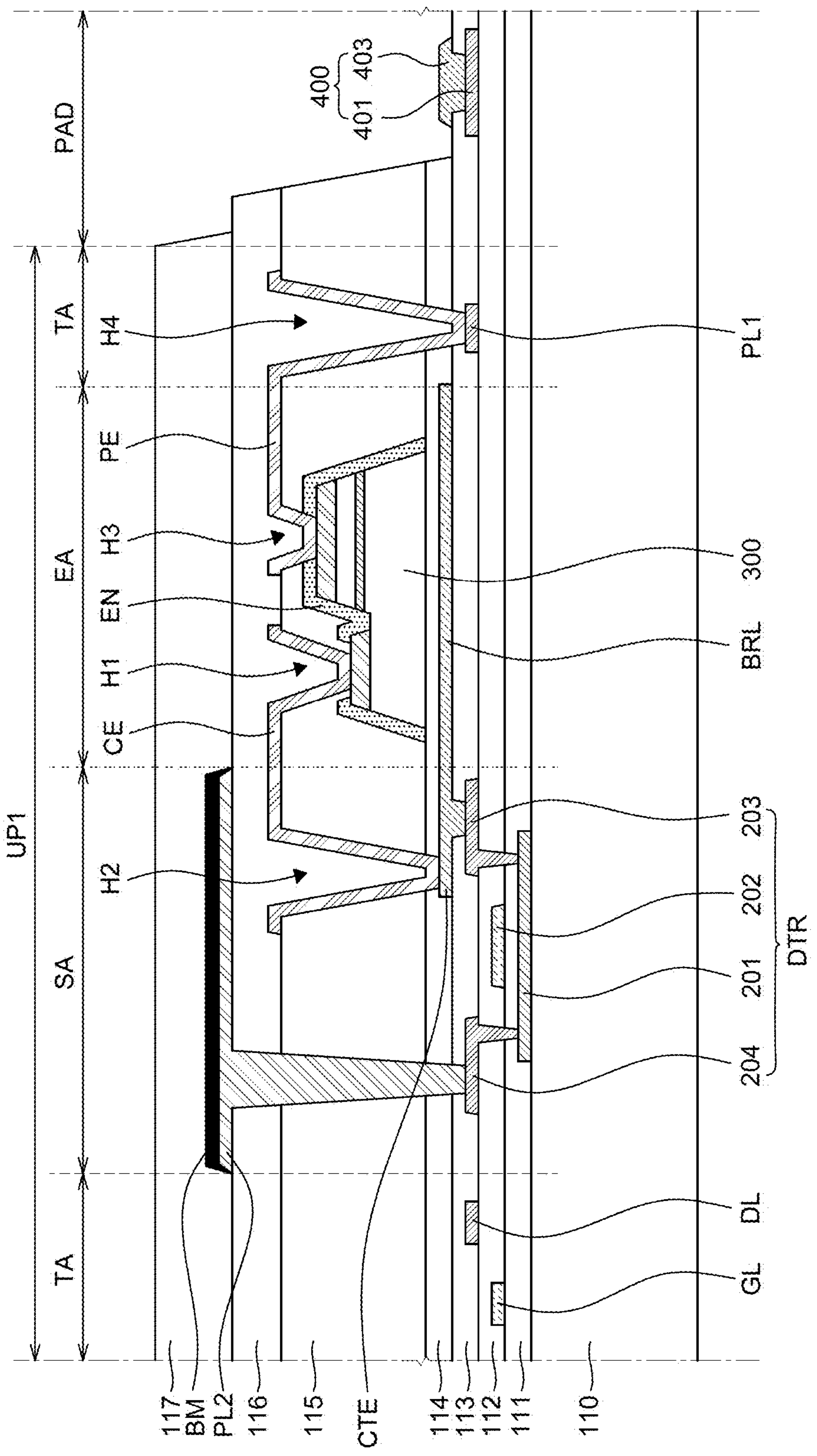
FIG. 8 is a cross-sectional view of a first pixel structure according to an exemplary embodiment of the present disclosure.
Figure 9:
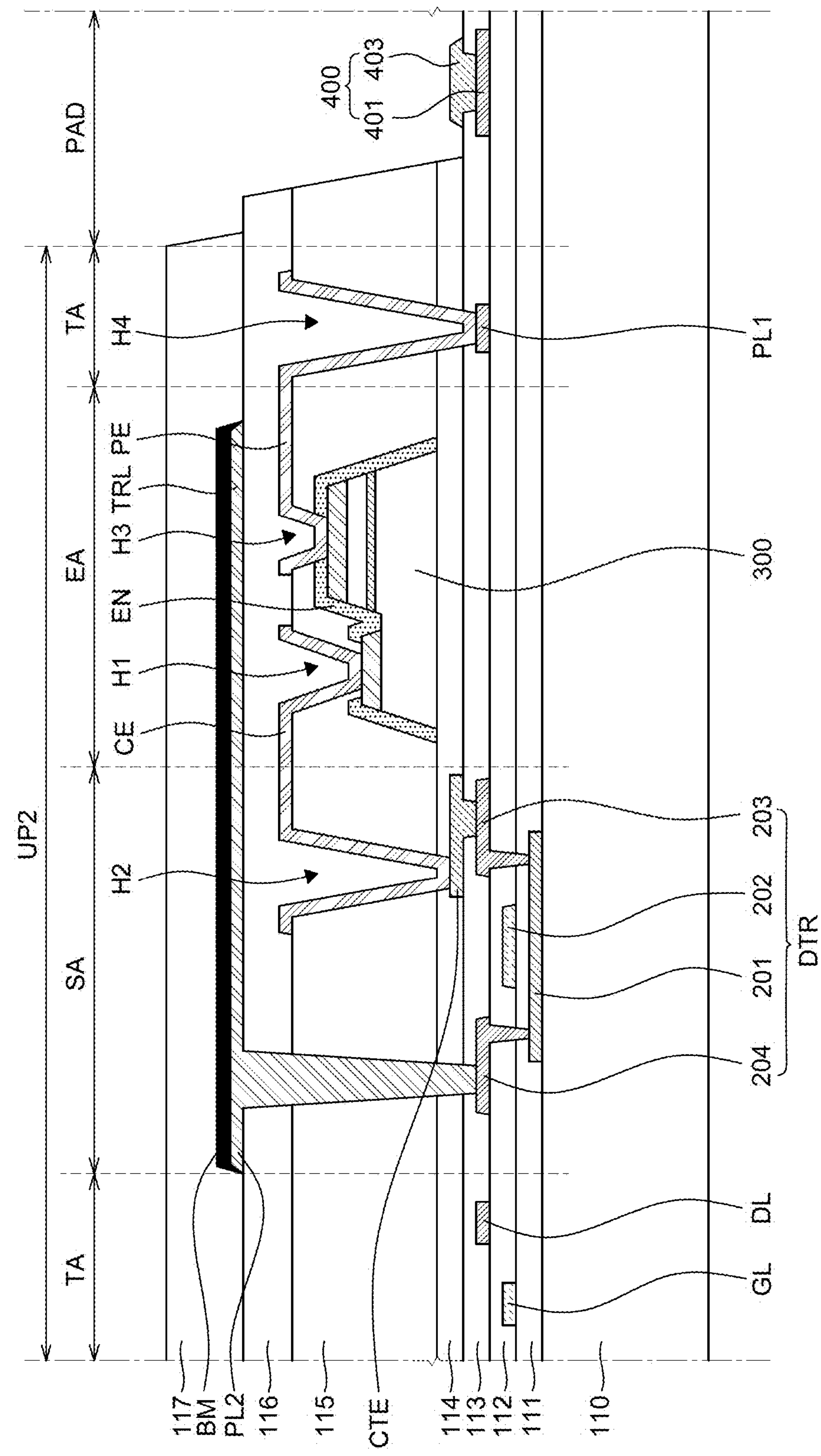
FIG. 9 is a cross-sectional view of a second pixel structure according to an exemplary embodiment of the present disclosure.

FIG. 8 is a cross-sectional view of a first pixel structure according to an exemplary embodiment of the present disclosure. FIG. 9 is a cross-sectional view of a second pixel structure according to an exemplary embodiment of the present disclosure. Each of FIGS. 8 and 9 shows a cross-sectional view of a pixel part including the transmissive region TA, the emissive region EA and the non-transmissive region SA, and the pad area PAD.

FIG. 8 shows a cross-sectional view of the transmissive region TA, the emissive region EA and the non-transmissive region SA of the first pixel UP1, and the pad area PAD. The light emitting chip 300 is disposed in the emissive region EA, and the pixel circuit is disposed in the non-transmissive region SA. Also, a pad electrode 400 is disposed in the pad area PAD. FIG. 8 illustrates the driving transistor DTR, which is directly connected to the light emitting element EL, of the pixel circuit. However, the present disclosure is not limited thereto. The illustrated transistor may be a switching transistor or a light emitting transistor depending on the type of the pixel circuit.

A substrate 110 serves to support various components included in the display panel DP and may be transparent to transmit light and may be made of an insulating material. For example, the substrate 110 may be made of glass or resin. Also, the substrate 110 may contain a polymer or plastic and may be made of a material having flexibility.

The driving transistor DTR is disposed on the substrate 110. The driving transistor DTR includes an active layer 201, a gate electrode 202, a source electrode 203, and a drain electrode 204. The active layer 201 is disposed on the substrate 110. The active layer 201 may be made of a semiconductor material such as an oxide semiconductor, amorphous silicon, or polysilicon, but is not limited thereto. A buffer layer may be disposed between the substrate 110 and the active layer 201, and the buffer layer may suppress permeation of moisture or impurities through the substrate 110.

A first insulating layer 111 is disposed on the active layer 201. The first insulating layer 111 is also referred to as a gate insulating layer, and serves to insulate the active layer 201 from the gate electrode 202. The first insulating layer 111 may be a single layer or a plurality of layers made of silicon oxide (SiOx) or silicon nitride (SiNx), but is not limited thereto.

The gate electrode 202 is disposed on the first insulating layer 111. The gate electrode 202 may be connected to the switching circuit STC. The gate electrode 202 may be made of a conductive material such as copper (Cu), aluminum (Al), molybdenum (Mo), nickel (Ni), titanium (Ti), chromium (Cr), or an alloy thereof, but is not limited thereto.

Meanwhile, the gate line GL is disposed together with the gate electrode 202 on the first insulating layer 111. The gate line GL may be formed of the same material through the same process as the gate electrode 202. The gate line GL may transfer a scan signal or an emission signal to the switching circuit STC.

A second insulating layer 112 is disposed on the gate electrode 202. The second insulating layer 112 and the first insulating layer 111 include contact holes through which each of the source electrode 203 and the drain electrode 204 are connected to the active layer 201. The second insulating layer 112 is a passivation layer for protecting the components under the second insulating layer 112. The second insulating layer 112 may be a single layer or a plurality of layers made of silicon oxide (SiOx) or silicon nitride (SiNx), but is not limited thereto.

The source electrode 203 and the drain electrode 204 electrically connected to the active layer 201 are disposed on the second insulating layer 112. The drain electrode 204 may be connected to the light emitting transistor ETR and the switching circuit STC, and the source electrode 203 may be connected to the cathode of the light emitting element EL. The source electrode 203 and the drain electrode 204 may be made of a conductive material such as copper (Cu), aluminum (Al), molybdenum (Mo), nickel (Ni), titanium (Ti), chromium (Cr), or an alloy thereof, but is not limited thereto. The driving transistor DTR may be turned on or off depending on a signal supplied from the switching circuit STC.

Meanwhile, the data line DL and the first power line PL1 are disposed together with the source electrode 203 and the drain electrode 204 on the second insulating layer 112. The data line DL and the first power line PL1 may be formed of the same material through the same process as the gate electrode 202, the source electrode 203 and the drain electrode 204. The data line DL may transfer a data voltage to the driving transistor DTR through the switching circuit STC. The first power line PL1 serves to transfer the high-potential voltage EVDD, and may transfer the high-potential voltage EVDD to the light emitting chip 300.

A third insulating layer 113 is disposed on the data line DL, the driving transistor DTR, and the first power line PL1. The third insulating layer 113 serves to protect the components under the third insulating layer 113. The third insulating layer 113 may be a single layer or a plurality of layers made of silicon oxide (SiOx) or silicon nitride (SiNx), but is not limited thereto. Also, the third insulating layer 113 may be a planarization layer for reducing a step difference of a structure under the third insulating layer 113.

A connection electrode CTE electrically connected to the source electrode 203 is disposed on the third insulating layer 113. The connection electrode CTE is connected to the source electrode 203 through a contact hole formed in the third insulating layer 113. The connection electrode CTE extends to the emissive region EA and is disposed under the light emitting chip 300. The electrode disposed under the light emitting chip 300 is referred to as the bottom reflective layer BRL. The bottom reflective layer BRL reflects light emitted from the light emitting chip 300 toward an upper side of the double-sided emissive transparent display device 100, i.e., from the light emitting chip 300 toward a direction opposite to the substrate 110. The bottom reflective layer BRL has a greater area than that of the light emitting chip 300 when viewed from the top. The bottom reflective layer BRL also has a greater length than that of the light emitting chip 300 when viewed from the cross section. In order to fully reflect light emitted from the light emitting chip 300, the bottom reflective layer BRL is formed to have a bottom area greater than a bottom area of the light emitting chip 300. The connection electrode CTE and the bottom reflective layer BRL may be made of a metal material having a high reflectance, such as silver (Ag), aluminum (Al), or an alloy thereof, but are not limited thereto. Herein, pure silver (Ag) may react with oxygen or nitrogen so that the reflectance may be lowered. Therefore, the bottom reflective layer BRL may be formed of a plurality of layers of ITO/Ag/ITO or formed by adding impurities such as palladium (Pd) or copper (Cu).

Also, the bottom reflective layer BRL may be electrically connected to the pixel circuit in the first pixel UP1. The cathode electrode CE may connect the bottom reflective layer BRL to the second electrode E2. The bottom reflective layer BRL may be formed by extending the source electrode 203 of the driving transistor DTR. Thus, the bottom reflective layer BRL and the source electrode 203 are in an equipotential state. Also, the source electrode 203 is electrically connected to the first semiconductor layer 301 through the second electrode E2. Thus, the bottom reflective layer BRL and the first semiconductor layer 301 are in an equipotential state. Therefore, it is possible to suppress a migration phenomenon of the bottom reflective layer BRL caused by a potential difference between a bottom portion of the light emitting chip 300 and the bottom reflective layer BRL. The relationship between the bottom reflective layer BRL and the light emitting chip 300 will be described in more detail with reference to the accompanying drawings.

An adhesive layer 114 is disposed on the connection electrode CTE. The adhesive layer 114 serves to fix the light emitting chip 300 onto the substrate 110, and may electrically insulate the bottom reflective layer BRL containing a metal material from the light emitting chip 300. However, the present disclosure is not limited thereto. In the light emitting element EL, the first semiconductor layer, the active layer, and the second semiconductor layer may be vertically laminated, and the first electrode may be disposed under the first semiconductor layer and the second electrode may be disposed on the second semiconductor layer. In this case, the adhesive layer 114 may contain a conductive material so that the first electrode of the light emitting element EL may be electrically connected to the bottom reflective layer BRL.

The adhesive layer 114 may be made of a heat-curing material or a photo-curing material. The adhesive layer 114 may be any one of adhesive polymers, epoxy resists, UV resins, polyimides, acrylates, urethanes, and polydimethylsiloxane (PDMS), but is not limited thereto.

The light emitting chip 300 may be formed on a separate growth substrate and then transferred onto the substrate 110 through a substrate separating process. The light emitting chip 300 is disposed to entirely overlap the adhesive layer 114. In the drawings, the light emitting chip 300 is illustrated as having a lateral structure in which the first electrode E1 and the second electrode E2 are horizontally disposed, but is not necessarily limited thereto. For example, the light emitting chip 300 may have a vertical structure in which the first electrode E1 and the second electrode E2 overlap each other, or may have a flip structure in which the first electrode E1 and the second electrode E2 are contacted on the substrate 110.

As shown in FIG. 8, the light emitting chip 300 may include an encapsulation film EN for protecting the first semiconductor layer 301, the active layer 303, and the second semiconductor layer 305. The encapsulation film EN covers side and top surfaces of the light emitting chip 300, but does not cover parts of the first electrode E1 and the second electrode E2. The encapsulation film EN may cover edges of the first electrode E1 and the second electrode E2. The parts of the first electrode E1 and the second electrode E2 which are not covered by the encapsulation film EN are in contact with an anode electrode PE and a cathode electrode CE, respectively. The anode electrode PE may connect the first power line to the first electrode E1.

A fourth insulating layer 115 is disposed on the light emitting chip 300, and may be a single layer or a plurality of layers. The fourth insulating layer 115 may be made of an organic material such as photo acryl, polyimide, benzocyclobutene resins, acrylates, etc., but is not limited thereto.

The fourth insulating layer 115 is disposed to cover the entire surface of the substrate 110. Also, the fourth insulating layer 115 is disposed adjacent to side surfaces of the light emitting chip 300 and thus may fix the light emitting chip 300 onto the substrate 110. Further, while the light emitting chip 300 is transferred to the substrate 110, the encapsulation film EN may be partially damaged or peeled off. Thus, the light emitting chip 300 with a part of the first semiconductor layer exposed may be disposed on the substrate 110. The fourth insulating layer 115 is formed to surround the side surfaces of the light emitting chip 300 and thus may electrically insulate the first semiconductor layer and the second semiconductor layer of the light emitting chip 300.

The fourth insulating layer 115 may planarize step differences between a plurality of light emitting chips 300 disposed in the display panel DP. The fourth insulating layer 115 compensates for a step difference on the substrate 110. Thus, the cathode electrode CE and the anode electrode PE may be smoothly connected to the light emitting chip 300 and the first power line PL1, respectively. In this case, the anode electrode PE may also be referred to as a pixel electrode, and the first power line PL1 may also be referred to as a common line.

The fourth insulating layer 115 may be thicker than the light emitting chip 300. Therefore, the fourth insulating layer 115 may overlap the top surface of the light emitting chip 300. The fourth insulating layer 115 may cover the encapsulation film EN between the first electrode E1 and the second electrode E2.

The fourth insulating layer 115 includes a first contact hole H1 for connecting the light emitting chip 300 and the cathode electrode CE and a second contact hole H2 for connecting the cathode electrode CE and the connection electrode CTE. Also, the fourth insulating layer 115 includes a third contact hole H3 for connecting the light emitting chip 300 and the anode electrode PE and a fourth contact hole H4 for connecting the anode electrode PE and the first power line PL1. In other words, the cathode electrode CE connects the light emitting chip 300 and the driving transistor DTR through the first contact hole H1 and the second contact hole H2. Also, the anode electrode PE connects the light emitting chip 300 and the first power line PL1 through the third contact hole H3 and the fourth contact hole H4. The second contact hole H2 is formed not only in the fourth insulating layer 115, but also in the adhesive layer 114. Also, the fourth contact hole H4 is formed not only in the fourth insulating layer 115, but also in the adhesive layer 114 and the third insulating layer 113. In this case, the first contact hole H1 and the second contact hole H2 may be disposed within the emissive region, the third contact hole H3 may be disposed within the non-transmissive region SA, and the fourth contact hole H4 may be disposed within the transmissive region TA. However, the fourth contact hole H4 is not limited thereto, and may be disposed within the non-transmissive region SA.

The first pixel UP1 is the top emissive pixel that emits light toward an upper side, which is a front surface, of the substrate, and, thus, the cathode electrode CE and the anode electrode PE are made of a transparent conductive material. The transparent conductive material may be indium tin oxide (ITO), indium zinc oxide (IZO), or the like, but is not limited thereto.

The cathode electrode CE and the anode electrode PE are physically separated on the encapsulation film EN and the fourth insulating layer 115 between the first electrode E1 and the second electrode E2. Therefore, the first semiconductor layer and the second semiconductor layer are electrically insulated, and, thus, the light emitting element EL may normally emit light.

A fifth insulating layer 116 is disposed on the fourth insulating layer 115. The fifth insulating layer 116 is formed inside the first contact hole H1, the second contact hole H2, the third contact hole H3, and the fourth contact hole H4 and thus planarizes the top surface of the light emitting chip 300. The fifth insulating layer 116 may be made of an organic material such as photo acryl, polyimide, benzocyclobutene resins, acrylates, etc., but is not limited thereto.

The second power line PL2 is disposed on the fifth insulating layer 116. In FIG. 8, the second power line PL2 is simply illustrated as being connected to the drain electrode 204 of the driving transistor DTR, but is not limited thereto. According to the pixel circuit shown in FIG. 6, the second power line PL2 is not directly connected to the drain electrode 204 of the driving transistor DTR, but may be connected to the switching circuit STC. Also, in FIG. 8, the first power line PL1 may be the first-first power line PL1-1 supplied with the high-potential voltage EVDD, and the second power line PL2 may be the first-second power line PL1-2 supplied with the low-potential voltage EVSS. In this case, the second power line PL2 may be directly connected to the drain electrode 204 of the driving transistor DTR as shown in the drawings, but may also be connected to the light emitting transistor ETR as shown in FIG. 6.

The second power line PL2 is disposed in the non-transmissive region SA. The second power line PL2 may be connected to the driving transistor DTR, the switching circuit STC or the light emitting transistor ETR through the contact holes formed in the fifth insulating layer 116, the fourth insulating layer 115, the adhesive layer 114, and the third insulating layer 113. The second power line PL2 serves as a reflective electrode like the connection electrode CTE, and may be made of a metal material having a high reflectance, such as silver (Ag), aluminum (Al), or an alloy thereof, but is not limited thereto. Herein, pure silver (Ag) may react with oxygen or nitrogen so that the reflectance may be lowered. Therefore, the bottom reflective layer BRL may be formed of a multiple layer of ITO/Ag/ITO or formed by adding impurities such as palladium (Pd) or copper (Cu). In the first pixel UP1, the second power line PL2 is not disposed in the emissive region EA, and, thus, light may be output upwards.

A black matrix BM is disposed in the non-transmissive region SA. The black matrix BM is disposed on the second power line PL2, and may be made of an insulating material. Further, the black matrix BM may include a black material or a light absorbing material. For example, the black matrix BM may be made of a carbon-based mixture and specifically, may include carbon black. The black matrix BM may absorb heat that may be concentrated on the second power line PL2 and then may radiate the heat to the outside. Therefore, the lifetime of the double-sided emissive transparent display device 100 may be extended. Also, the black matrix BM is disposed to surround the emissive region EA and thus may suppress color mixing between the light emitting chips 300. Therefore, it is possible to improve the quality of the double-sided emissive transparent display device 100.

A protection layer 117 is disposed on the fifth insulating layer 116 and the black matrix BM. The protection layer 117 serves to protect the components under the protection layer 117. The protection layer 117 may be a single layer or a plurality of layers made of translucent epoxy, silicon oxide (SiOx) or silicon nitride (SiNx), but is not limited thereto. The fourth insulating layer 115, the fifth insulating layer 116, and the protection layer 117 are formed stepwise. Thus, side surfaces of the fourth insulating layer 115, the fifth insulating layer 116, and the protection layer 117 are slanted from the substrate 110 to reduce a step difference. In some cases, the protection layer 117 may be formed of a plurality of layers and may cover top and side surfaces of the fourth insulating layer 115 and the fifth insulating layer 116 to further suppress permeation of moisture and oxygen.

Referring to FIGS. 1A and 1B, the pad area PAD is disposed in the non-active area NA on one side of the display panel DP. FIG. 8 shows a cross-sectional view of the pad area PAD. A plurality of pad electrodes 400 is disposed in the pad area PAD. As described above, the film 120 to which the driving circuit 125 is attached may be attached to the pad electrode 400. In the pad area PAD, the adhesive layer 114, the fourth insulating layer 115, the fifth insulating layer 116, and the protection layer 117 are not disposed and the pad electrode 400 is exposed. That is, the pad electrode 400 may be exposed from a plurality of planarization layers. Thus, the pad area PAD is supplied with a signal from the outside through the pad electrode 400.

The pad electrode 400 may include a first pad electrode 401 and a second pad electrode 403. The first pad electrode 401 may be made of the same material on the same layer as the source electrode 203 and the drain electrode 204 of the driving transistor DTR. The second pad electrode 403 may be made of the same material on the same layer as the connection electrode CTE. Although the pad electrode is briefly illustrated as including only two pad electrodes, the pad electrode may be formed as a triple layer or more in some cases.

FIG. 9 shows a cross-sectional view of the transmissive region TA, the emissive region EA and the non-transmissive region SA of the second pixel UP2, and the pad area PAD. The light emitting chip 300 is disposed in the emissive region EA, and the pixel circuit is disposed in the non-transmissive region SA. Also, the pad electrode 400 is disposed in the pad area PAD. FIG. 9 illustrates the driving transistor DTR, which is directly connected to the light emitting element EL, of the pixel circuit. However, the present disclosure is not limited thereto. The transistor may be a switching transistor or a light emitting transistor depending on the type of the pixel circuit.

The illustration of FIG. 9 is substantially the same as that of FIG. 8 except for the presence or absence and locations of the bottom reflective layer BRL and the top reflective layer TRL. Thus, description of repeated components will be omitted.

In the second pixel UP2, the connection electrode CTE does not extend to the emissive region EA, but just electrically connects the source electrode 203 or drain electrode of the driving transistor DTR to the cathode electrode CE. Also, the second pixel UP2 is the bottom emissive pixel that emits light toward a lower side, which is a back surface, of the substrate, and, thus, the electrodes disposed on the light emitting chip 300 do not need to be made of a transparent conductive material. For example, the cathode electrode CE and the anode electrode PE are made of a transparent conductive material as in the first pixel UP1 for the convenience of process, but are not limited thereto.

If the cathode electrode CE and the anode electrode PE are made of a transparent conductive material, a reflective electrode is disposed on the light emitting chip 300 to reflect light emitted from the light emitting chip 300 downwards (toward the substrate 110). Specifically, the reflective electrode is disposed on the fifth insulating layer 116 in the emissive region EA and referred to as "top reflective layer TRL".

The top reflective layer TRL may be electrically connected to the pixel circuit in the second pixel UP2. The top reflective layer TRL is formed by extending the second power line PL2 disposed in the non-transmissive region SA to the emissive region EA and overlaps the light emitting chip 300. As described above, the second power line PL2 may be connected to the drain electrode 204 of the driving transistor DTR. Alternatively, the second power line PL2 may be connected to the switching circuit STC without being directly connected to the drain electrode 204 of the driving transistor DTR. Also, the first power line PL1 may be the first-first power line PL1-1 supplied with the high-potential voltage EVDD, and the second power line PL2 may be the first-second power line PL1-2 supplied with the low-potential voltage EVSS. In this case, the second power line PL2 may be directly connected to the drain electrode 204 of the driving transistor DTR as shown in the drawings, but may also be connected to the light emitting transistor ETR as shown in FIG. 6. The top reflective layer TRL does not float and is applied with a constant voltage. Thus, it is possible to suppress a change in potential of the top reflective layer TRL caused by the surrounding environment of the top reflective layer TRL. Further, for example, if the second power line PL2 is applied with the low-potential voltage EVSS, the top reflective layer TRL may reduce a voltage drop of the low-potential voltage EVSS. In this case, the thickness of the top reflective layer TRL may increase as necessary. The second power line PL may be applied with one of the high-potential voltage EVDD, the low-potential voltage EVSS, and the reference voltage Vref.

The top reflective layer TRL reflects light emitted from the light emitting chip 300 toward a lower side of the double-sided emissive transparent display device 100, i.e., from the light emitting chip 300 toward the substrate 110. The top reflective layer TRL has a greater area than that of the light emitting chip 300 when viewed from the top. The top reflective layer TRL also has a greater length than that of the light emitting chip 300 when viewed from the side. In order to fully reflect light emitted from the light emitting chip 300, the top reflective layer TRL is formed to have a bottom area greater than the bottom area of the light emitting chip 300. The second power line PL2 and the top reflective layer TRL may be made of a metal material having a high reflectance, such as silver (Ag), aluminum (Al), or an alloy thereof, but are not limited thereto. Herein, pure silver (Ag) may react with oxygen or nitrogen so that the reflectance may be lowered. Therefore, the top reflective layer TRL may be formed of a multiple layer of ITO/Ag/ITO or formed by adding impurities such as palladium (Pd) or copper (Cu). The relationship between the top reflective layer TRL and the light emitting chip 300 will be described in more detail with reference to the accompanying drawings.

The black matrix BM is disposed in the non-transmissive region SA. The black matrix BM is disposed on the second power line PL2, and may be made of an insulating material. Since the second pixel UP2 is the bottom emissive pixel, in the case of the second pixel UP2, the black matrix BM may also be disposed in the emissive region EA.

Figure 10:
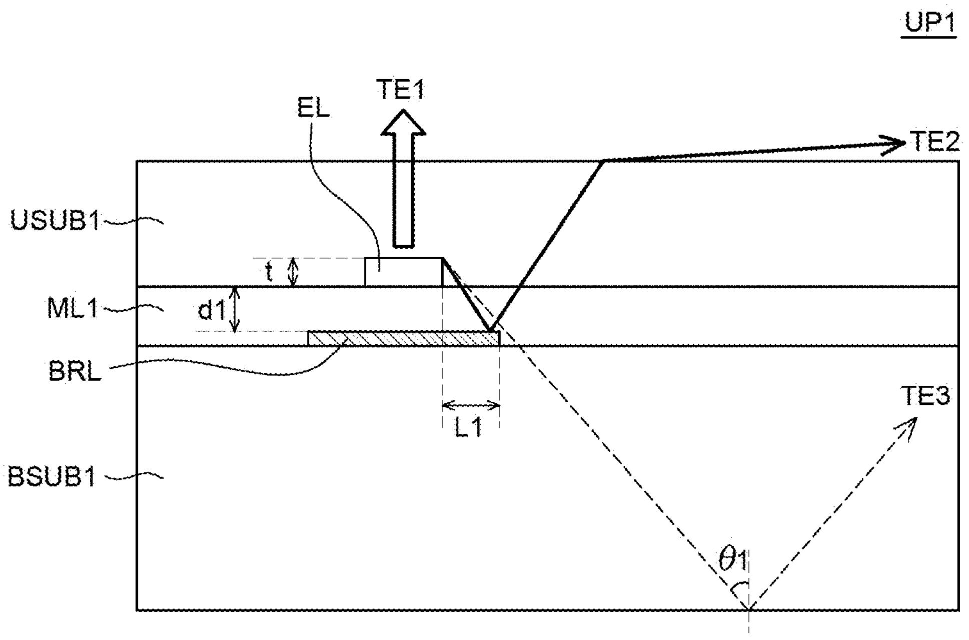
FIG. 10 is a cross-sectional view showing top emission conditions of the first pixel structure according to an exemplary embodiment of the present disclosure.
Figure 11:
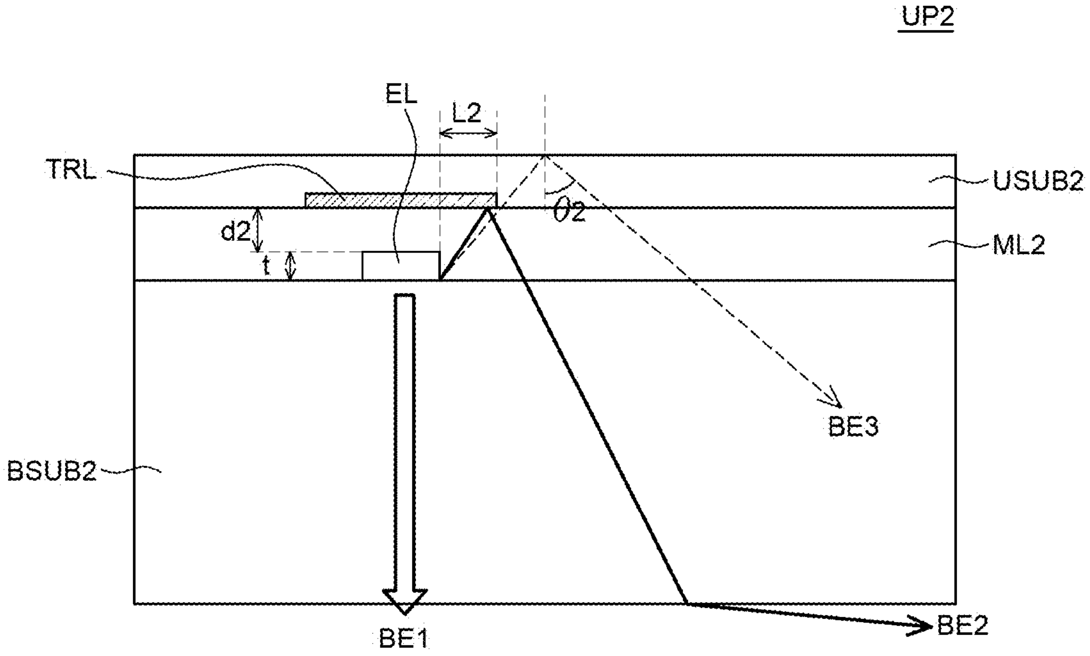
FIG. 11 is a cross-sectional view showing bottom emission conditions of the second pixel structure according to an exemplary embodiment of the present disclosure.

FIG. 10 is a cross-sectional view showing top emission conditions of the first pixel structure according to an exemplary embodiment of the present disclosure. FIG. 11 is a cross-sectional view showing bottom emission conditions of the second pixel structure according to an exemplary embodiment of the present disclosure.

FIG. 10 schematically illustrates the first pixel UP1 including the light emitting element EL, the bottom reflective layer BRL, a first intermediate layer ML1, a first bottom layer BSUB1, and a first top layer USUB1. Also, FIG. 10 shows the light emitting element EL, an optical path of light emitted from the light emitting element EL, and a relationship with the bottom reflective layer BRL. Specifically, the relationship between the bottom reflective layer BRL and the light emitting element EL for reflecting light upwards from the first pixel UP1 will be described.

The first bottom layer BSUB1 may comprehensively refer to all the layers under the bottom reflective layer BRL. The bottom reflective layer BRL is disposed on the first bottom layer BSUB1, and the first intermediate layer ML1 is disposed on the first bottom layer BSUB1 and the bottom reflective layer BRL. The light emitting element EL is disposed on the first intermediate layer ML1, and the first top layer USUB1 is disposed on the light emitting element EL and the first intermediate layer ML1. The bottom reflective layer BRL may be disposed between the thin film transistor of the pixel circuit in the first pixel UP1 and the light emitting element EL. The first top layer USUB1 may comprehensively refer to all the layers on the light emitting element EL. In the first pixel UP1 according to an exemplary embodiment of the present disclosure, the first intermediate layer ML1 may be the adhesive layer 114, but is not limited thereto.

In the first pixel UP1, a separation distance between the bottom reflective layer BRL and the light emitting element EL is denoted by d1 and a thickness of the light emitting element EL is denoted by t. Also, a distance from a side surface of the light emitting element EL to a side surface of the bottom reflective layer BRL is denoted by L1.

Light emitted from the light emitting element EL is output in all directions. The light includes light TE1 directly output upwards through the first top layer USUB1, light TE2 reflected from the bottom reflective layer BRL and then output upwards through the first top layer USUB1, and light TE3 passing through the side surface of the bottom reflective layer BRL and penetrating the first bottom layer BSUB1.

Since the first pixel UP1 is the top emissive pixel, the light TE3 passing through the side surface of the bottom reflective layer BRL and penetrating the first bottom layer BSUB1 needs to be reflected and output upwards without passing through the first bottom layer BSUB1. When light emitted from the light emitting element EL passes through the side surface of the bottom reflective layer BRL and is incident into the first bottom layer BSUB1, an incident angle is θ1. The light TE3 is total-reflected without penetrating the first bottom layer BSUB1 under the total bottom reflection condition represented by the following Equation 1.

$$L1=(d1+t)\times\tan\theta1 \qquad \text{[Equation 1]}$$

When a refractive index of the first bottom layer BSUB1, specifically, the lowermost layer of the first bottom layer BSUB1 is n1, total reflection occurs under the condition represented by the following Equation 2.

$$n1\times\sin\theta1=1 \qquad \text{[Equation 2]}$$

The lowermost layer included in the first bottom layer BSUB1 may be a glass or anti-scattering film. For example, if the first bottom layer BSUB1 is made of glass, n1 is 1.52. According to Equations 1 and 2, a distance L1 from the side surface of the light emitting element EL to the side surface of the bottom reflective layer BRL is about 0.874×(d1+t). The distance from the side surface of the light emitting element EL to the side surface of the bottom reflective layer BRL is similar to the sum of a distance from the bottom reflective layer BRL to the light emitting element EL and a height of the light emitting element EL. Equations 1 and 2 are the formulas of critical angle for total bottom reflection of the light TE3 in the first pixel UP1. Therefore, the L1 corresponds to the minimum distance from the side surface of the light emitting element EL to the side surface of the bottom reflective layer BRL.

That is, in the first pixel UP1 according to an exemplary embodiment of the present disclosure, a length from the side surface of the light emitting element EL to the side surface of the bottom reflective layer BRL may be equal to or more than the sum of a vertical distance from the bottom reflective layer BRL to the light emitting element EL and a height of the light emitting element EL. Therefore, the first pixel UP1 may fully output light emitted from the light emitting element EL upwards.

FIG. 11 schematically illustrates the second pixel UP2 including the light emitting element EL, the top reflective layer TRL, a second intermediate layer ML2, a second bottom layer BSUB2, and a second top layer USUB2. Also, FIG. 11 shows the light emitting element EL, an optical path of light emitted from the light emitting element EL, and a relationship with the top reflective layer TRL. Specifically, the relationship between the top reflective layer TRL and the light emitting element EL for outputting light downwards from the second pixel UP2 will be described.

The second bottom layer BSUB2 may comprehensively refer to all the layers under the light emitting element EL. The light emitting element EL is disposed on the second bottom layer BSUB2, and the second intermediate layer ML2 is disposed on the second bottom layer BSUB2 and the light emitting element EL. The top reflective layer TRL is s disposed on the second intermediate layer ML2, and the second top layer USUB2 is disposed on the top reflective layer TRL and the second intermediate layer ML2. The second top layer USUB2 may comprehensively refer to all the layers on the top reflective layer TRL. In the second pixel UP2 according to an exemplary embodiment of the present disclosure, the second intermediate layer ML2 may include the fourth insulating layer 115 and the fifth insulating layer 116, but is not limited thereto.

In the second pixel UP2, a separation distance between the light emitting element EL and the top reflective layer TRL is denoted by d2 and a thickness of the light emitting element EL is denoted by t. Also, a distance from a side surface of the light emitting element EL to a side surface of the top reflective layer TRL is denoted by L2.

Light emitted from the light emitting element EL is output in all directions. The light includes light BE1 directly output downwards through the second bottom layer BSUB2, light BE2 reflected from the top reflective layer TRL and then output downwards through the second bottom layer BSUB2, and light BE3 passing through the side surface of the top reflective layer TRL and penetrating the second top layer USUB2.

Since the second pixel UP2 is the bottom emissive pixel, the light BE3 passing through the side surface of the top reflective layer TRL and penetrating the second top layer USUB2 needs to be reflected and output downwards without passing through the second top layer USUB2. When light emitted from the light emitting element EL passes through the side surface of the top reflective layer TRL and is incident into the second top layer USUB2, a reflection angle is θ2. The light BE3 is total-reflected without penetrating the second top layer USUB2 under the total top reflection condition represented by the following Equation 3.

$$L2=(d2+t)\times\tan\theta 2 \qquad \text{[Equation 3]}$$

When a refractive index of the second top layer USUB2, specifically, the uppermost layer of the second top layer USUB2 is n2, total reflection occurs under the condition represented by the following Equation 4.

$$n2\times\sin\theta 2=1 \qquad \text{[Equation 4]}$$

The uppermost layer included in the second top layer USUB2 may be a glass or anti-scattering film. For example, if the second top layer USUB2 is an anti-scattering film, n2 is 1.48. According to Equations 3 and 4, a distance L2 from the side surface of the light emitting element EL to the side surface of the top reflective layer TRL is about 0.916×(d2+t). The distance from the side surface of the light emitting element EL to the side surface of the top reflective layer TRL is similar to the sum of a distance from the top reflective layer TRL to the light emitting element EL and a height of the light emitting element EL. Equations 3 and 4 are the formulas of critical angle for total top reflection of the BE3 in the second pixel UP2. Therefore, the L2 corresponds to the minimum distance from the side surface of the light emitting element EL to the side surface of the top reflective layer TRL.

That is, in the second pixel UP2 according to an exemplary embodiment of the present disclosure, a length from the side surface of the light emitting element EL to the side surface of the top reflective layer TRL may be equal to or more than the sum of a vertical distance from the top reflective layer TRL to the light emitting element EL and a height of the light emitting element EL. Therefore, the second pixel UP2 may fully output light emitted from the light emitting element EL downwards.

In the display device according to an exemplary embodiment of the present disclosure, the top emissive pixel and the bottom emissive pixel include the bottom reflective layer BRL and the top reflective layer TRL, respectively, so as to overlap the light emitting element EL. Also, both the bottom reflective layer BRL and the top reflective layer TRL have a greater area or size than the light emitting element EL. Thus, light emitted from the top emissive pixel may be fully output upwards, and light emitted from the bottom emissive pixel may be fully output downwards.

Figure 12:
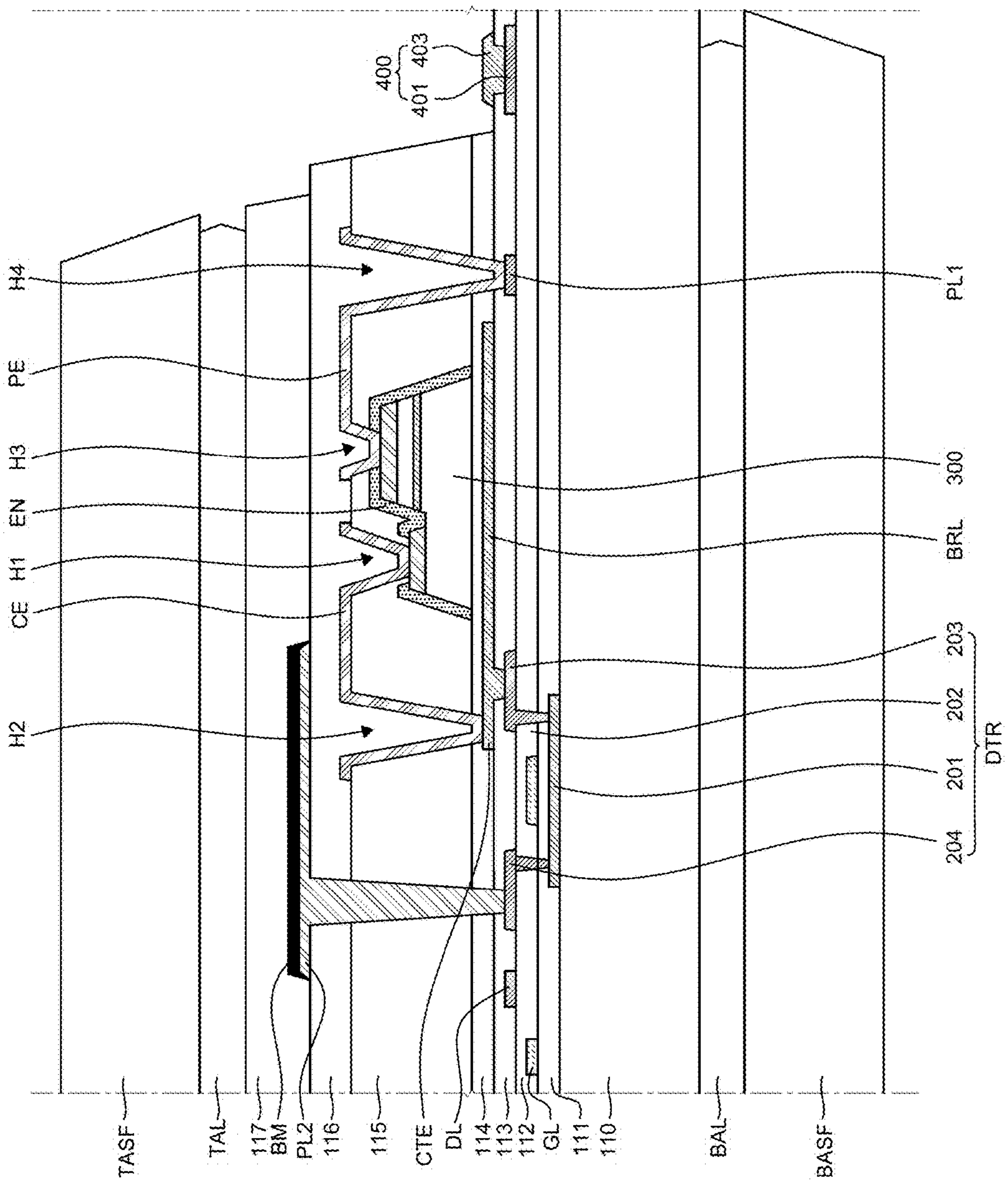
FIG. 12 is a cross-sectional view of a double-sided emissive transparent display device according to another exemplary embodiment of the present disclosure.

FIG. 12 is a cross-sectional view of a double-sided emissive transparent display device according to another exemplary embodiment of the present disclosure. FIG. 12 is a cross-sectional view further illustrating a top adhesive layer TAL, a top anti-scattering film TASF, a bottom adhesive layer BAL, and a bottom anti-scattering film BASF in addition to the illustration of FIG. 8. Thus, description of repeated components will be omitted.

FIG. 12 illustrates an exemplary embodiment of the first pixel UP1, but may be equally applied to the second pixel UP2.

An anti-scattering film may be attached to each of bottom portions and top portions of the substrate 110 and the protection layer 117. The anti-scattering film may be attached to a bottom portion or top portion of the substrate 110. The bottom anti-scattering film BASF may be attached to the bottom portion of the substrate 110 using the bottom adhesive layer BAL. Also, the top anti-scattering film TASF may be attached to the top portion of the protection layer 117 using the top adhesive layer TAL. The top anti-scattering film TASF may reduce external light reflection by covering the entire area except for the pad area PAD. Further, the bottom anti-scattering film BASF may reduce external light reflection and the risk of damage to the substrate 110 by covering the entire area of the substrate 110.

The anti-scattering film is equally attached to each of both sides of the double-sided emissive transparent display device 100 according to an exemplary embodiment of the present disclosure. Thus, an image may be equally displayed on both the front surface and the back surface of the display device.

The exemplary embodiments of the present disclosure can also be described as follows:

According to an aspect of the present disclosure, there is provided a double-sided emissive transparent display device. The double-sided emissive transparent display device comprises a first pixel that emits light toward an upper side, which is a front surface, of a substrate, a second pixel that emits light toward a lower side, which is a back surface, of the substrate, a plurality of lines disposed in the first pixel and the second pixel and a pad electrode connected to the plurality of lines, wherein the first pixel includes a first light emitting element, a first pixel circuit connected to the first light emitting element and some of the plurality of lines and a bottom reflective layer that is disposed under the first light emitting element to overlap the first light emitting element and has a greater size than the first light emitting element, and the second pixel includes a second light emitting element, a second pixel circuit connected to the second light emitting element and the others of the plurality of lines and a top reflective layer that is disposed on the second light emitting element to overlap the second light emitting element and has a greater size than the second light emitting element.

The top reflective layer may be electrically connected to the second pixel circuit, and the bottom reflective layer is electrically connected to the first pixel circuit.

The first light emitting element may include a first main light emitting element and a first auxiliary light emitting element, and the second light emitting element includes a second main light emitting element and a second auxiliary light emitting element.

The first pixel circuit may be disposed to correspond in one-to-one with the number of the first light emitting element, and the second pixel circuit is disposed to correspond in one-to-one with the number of the second light emitting element.

The top reflective layer and the bottom reflective layer may be made of a metal material having a high reflectance.

The first pixel and the second pixel respectively may include transmissive regions, emissive regions in which the first light emitting element and the second light emitting element are disposed, and non-transmissive regions in which the first pixel circuit and the second pixel circuit are disposed.

A black matrix may be disposed in the non-transmissive region.

The double-sided emissive transparent display device may further e a plurality of planarization layers surrounding the first light emitting element and the second light emitting element, wherein the top reflective layer penetrates the plurality of planarization layers and is connected to the pixel circuit.

The pad electrode may be exposed from the plurality of planarization layers.

The double-sided emissive transparent display device may further comprise an adhesive layer disposed between the first pixel circuit and the first light emitting element, wherein the bottom reflective layer is disposed under the adhesive layer.

According to another aspect of the present disclosure, there is provided a double-sided emissive transparent display device. The double-sided emissive transparent display device comprises a substrate that includes an emissive region including a top emissive region and a bottom emissive region, a transmissive region, and a non-transmissive region a first light emitting element and a second light emitting element disposed on the substrate in the emissive region a plurality of pixel circuits configured to supply driving currents to the first light emitting element and the second light emitting element in the non-transmissive region a bottom reflective layer overlapping the first light emitting element between the first light emitting element disposed in the top emissive region and the substrate and a top reflective layer overlapping the second light emitting element on the second light emitting element disposed in the bottom emissive region.

The top reflective layer may have a greater area than the first light emitting element, and the bottom reflective layer has a greater area than the second light emitting element.

A side surface of the top reflective layer may be spaced apart from a side surface of the first light emitting element at a distance equal to or more than the sum of a vertical distance from the top reflective layer to the first light emitting element and a height of the first light emitting element, and a side surface of the bottom reflective layer is spaced apart from a side surface of the second light emitting element at a distance equal to or more than the sum of a vertical distance from the bottom reflective layer to the second light emitting element and a height of the second light emitting element.

The double-sided emissive transparent display device may further comprise an anti-scattering film attached to a bottom portion or top portion of the substrate.

Each of the plurality of pixel circuits may include a thin film transistor, the thin film transistor includes a gate electrode, an active layer, a source electrode, and a drain electrode, and the bottom reflective layer is disposed between the thin film transistor and the first light emitting element.

The double-sided emissive transparent display device may further comprise a connection electrode that connects the first light emitting element to the source electrode or the drain electrode, wherein the bottom reflective layer extends from the connection electrode.

The double-sided emissive transparent display device may further comprise a cathode electrode that connects the first light emitting element to the connection electrode.

The double-sided emissive transparent display device may further comprise a first electrode and a second electrode on the substrate, wherein the first light emitting element includes a first semiconductor layer, an active layer, and a second semiconductor layer, the first electrode is directly disposed on the second semiconductor layer, the second electrode is directly disposed on the first semiconductor layer, and the cathode electrode connects the bottom reflective layer to the second electrode.

The double-sided emissive transparent display device may further comprise a first power line made of the same material on the same layer as one of the gate electrode, the source electrode, and the drain electrode and an anode electrode that connects the first power line to the first electrode.

The plurality of pixel circuits may be connected to a plurality of second power lines applied with one of a high-potential voltage, a low-potential voltage, and a reference voltage, and the top reflective layer is electrically connected to one of the plurality of second power lines.

It will be apparent to those skilled in the art that various modifications and variations can be made in the double-sided emissive transparent display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a substrate comprising an active area and a non-active area, the non-active area including a pad area;

a thin film transistor disposed on the substrate;

a reflective layer disposed on the thin film transistor and connected to the thin film transistor;

a plurality of light emitting element disposed on the reflective layer and overlapped with the plurality of light emitting element;

an encapsulation film disposed on the plurality of light emitting element;

at least one planarization layer disposed on the plurality of light emitting element;

a cathode and an anode connected to the plurality of light emitting element;

a first power line connected to the anode;

a black matrix disposed to surround the plurality of light emitting element;

a protection layer disposed on the plurality of light emitting element and the black matrix;

a second power line connected to the cathode; and a panel driving circuit disposed in the non-active area.

2. The display device according to claim 1, wherein the cathode and the anode are disposed on a same layer.

3. The display device according to claim 1, wherein the cathode is disposed on one side of the plurality of light emitting element, and the anode is disposed on the other side of the plurality of light emitting element, which is opposite to the one side.

4. The display device according to claim 1, wherein the cathode and the anode are arranged facing to the reflective layer.

5. The display device according to claim 1, wherein the first power line is a high-potential voltage line.

6. The display device according to claim 1, wherein the black matrix is disposed between the plurality of light emitting element.

7. The display device according to claim 1, wherein the encapsulation film comprises a plurality of layers.

8. The display device according to claim 1, wherein the protection layer comprises a plurality of layers.

9. The display device according to claim 1, further comprising:

a plurality of pad electrodes disposed in the pad area, wherein the plurality of pad electrodes is exposed from the at least one planarization layer.

10. The display device according to claim 9, wherein the plurality of pad electrodes includes an electrode made of a same material and disposed on a same layer as the first power line.

11. The display device according to claim 9, wherein the plurality of pad electrodes includes an electrode made of a same material and disposed on a same layer as the reflective layer.

12. The display device according to claim 1, wherein the second power line is disposed between the at least one planarization layer and the black matrix.

13. The display device according to claim 12, wherein an area of the black matrix and an area of the second power line on a plane are same.

14. The display device according to claim 1, wherein the first power line is supplying a high-potential voltage to the plurality of light emitting element, and disposed under the plurality of light emitting element, wherein the second power line is supplying a low-potential voltage to the plurality of light emitting element, and disposed on the plurality of light emitting element.

* * * * *